US009254532B2

(12) United States Patent
Kulkarni et al.

(10) Patent No.: US 9,254,532 B2
(45) Date of Patent: Feb. 9, 2016

(54) METHODS OF FABRICATING LOW MELTING POINT SOLDER REINFORCED SEALANT AND STRUCTURES FORMED THEREBY

(75) Inventors: Deepak V. Kulkarni, Chandler, AZ (US); Carl L. Deppisch, Chandler, AZ (US); Leonel R. Arana, Phoenix, AZ (US); Gregory S. Constable, Chandler, AZ (US); Sriram Srinivasan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 421 days.

(21) Appl. No.: 12/655,407

(22) Filed: Dec. 30, 2009

(65) Prior Publication Data

US 2011/0159310 A1    Jun. 30, 2011

(51) Int. Cl.
| H01L 23/02 | (2006.01) |
| H01L 23/12 | (2006.01) |
| H01L 23/10 | (2006.01) |
| H01L 23/34 | (2006.01) |
| B23K 1/00 | (2006.01) |
| B23K 3/08 | (2006.01) |

(52) U.S. Cl.
CPC ............. *B23K 1/0016* (2013.01); *B23K 3/085* (2013.01); *H01L 2224/16225* (2013.01); *H01L 2224/73253* (2013.01); *H01L 2924/16251* (2013.01); *Y10T 428/12222* (2015.01)

(58) Field of Classification Search
CPC ............... H01L 2924/00; H01L 2924/15311; H01L 2224/3225; H01L 2224/16225; H01L 2224/73204; H01L 2224/73253; H01L 2224/03013; H01L 2224/26; H01L 2224/40491; H01L 2224/48491; H01L 2924/16251; H01L 21/4871; H01L 23/34; H01L 23/345; H01L 23/36; H01L 23/367; H01L 23/40; H01L 23/488; B23K 1/0016; B23K 3/085; E04B 1/944; E04C 3/34; Y10T 428/12222

USPC .................. 257/704, 706, 710, 712, E23.08, 257/E23.101, E23.193, 717; 156/307.3; 228/203; 428/576; 52/423
See application file for complete search history.

(56) References Cited

U.S. PATENT DOCUMENTS

| 4,656,499 | A | * | 4/1987 | Butt ............................... 257/677 |
| 5,153,709 | A | * | 10/1992 | Fukuoka ....................... 257/704 |
| 5,184,211 | A | * | 2/1993 | Fox ............................... 257/706 |
| 5,532,514 | A | * | 7/1996 | Kozono ......................... 257/728 |
| 5,909,056 | A | * | 6/1999 | Mertol .......................... 257/704 |
| 5,945,735 | A | * | 8/1999 | Economikos et al. ........ 257/710 |
| 5,959,353 | A | * | 9/1999 | Tomita .......................... 257/729 |
| 6,459,160 | B1 | * | 10/2002 | Goldmann et al. ........... 257/778 |
| 6,501,175 | B2 | * | 12/2002 | Yamashita .................... 257/737 |
| 6,504,096 | B2 | * | 1/2003 | Okubora ....................... 174/521 |
| 6,538,319 | B2 | * | 3/2003 | Terui ............................. 257/704 |

(Continued)

OTHER PUBLICATIONS

Dimensionally Controlled Semiconductor Package, Feb. 1, 1984, IBD TDB 2/84, vol. 26, issue 9, p. 4497.*

*Primary Examiner* — Teresa M Arroyo
(74) *Attorney, Agent, or Firm* — Blakely, Sokoloff, Taylor & Zafman LLP

(57) ABSTRACT

Methods and associated structures of forming a package structure including forming a low melting point solder material on a solder resist opening location of an IHS keep out zone, forming a sealant in a non SRO keep out zone region; attaching the IHS to the sealant, and curing the sealant, wherein a solder joint is formed between the IHS and the low melting point solder material.

12 Claims, 8 Drawing Sheets

(56) References Cited

U.S. PATENT DOCUMENTS

| | | | |
|---|---|---|---|
| 6,602,737 B2* | 8/2003 | Wu | 438/122 |
| 6,753,602 B2* | 6/2004 | Wu | 257/712 |
| 6,977,396 B2* | 12/2005 | Shen et al. | 257/100 |
| 7,351,599 B2* | 4/2008 | Shen et al. | 438/26 |
| 7,633,150 B2* | 12/2009 | Shiraishi | 257/704 |
| 7,968,999 B2* | 6/2011 | Celik et al. | 257/707 |
| 8,004,096 B2* | 8/2011 | Fukuzono | 257/791 |
| 8,247,900 B2* | 8/2012 | Yuan | 257/710 |
| 8,379,400 B2* | 2/2013 | Sunohara | 361/760 |
| 2001/0050418 A1* | 12/2001 | Yamashita | 257/666 |
| 2002/0063326 A1* | 5/2002 | Nakashima | 257/704 |
| 2002/0074146 A1* | 6/2002 | Okubora | 174/52.2 |
| 2002/0090761 A1* | 7/2002 | Goldmann et al. | 438/124 |
| 2002/0155640 A1* | 10/2002 | Wu | 438/122 |
| 2003/0104651 A1* | 6/2003 | Kim et al. | 438/106 |
| 2003/0222336 A1* | 12/2003 | Wu | 257/678 |
| 2004/0036162 A1* | 2/2004 | Chuang et al. | 257/717 |
| 2005/0133904 A1* | 6/2005 | Kim et al. | 257/704 |
| 2006/0012016 A1* | 1/2006 | Betz et al. | 257/678 |
| 2006/0060988 A1* | 3/2006 | Edwards | 257/794 |
| 2006/0124700 A1* | 6/2006 | Houle et al. | 228/101 |
| 2006/0151203 A1* | 7/2006 | Krueger et al. | 174/260 |
| 2007/0262440 A1* | 11/2007 | Asaoka | 257/704 |
| 2007/0274060 A1* | 11/2007 | Kiuchi et al. | 361/820 |
| 2008/0254573 A1* | 10/2008 | Sir et al. | 438/122 |
| 2009/0218680 A1* | 9/2009 | Celik et al. | 257/712 |
| 2011/0156235 A1* | 6/2011 | Yuan | 257/690 |
| 2011/0183465 A1* | 7/2011 | Gerber et al. | 438/108 |
| 2012/0043669 A1* | 2/2012 | Refai-Ahmed et al. | 257/777 |
| 2013/0241039 A1* | 9/2013 | Choi et al. | 257/659 |
| 2013/0258610 A1* | 10/2013 | Li et al. | 361/748 |

* cited by examiner

METHODS OF FABRICATING LOW MELTING POINT SOLDER REINFORCED SEALANT AND STRUCTURES FORMED THEREBY

BACKGROUND OF THE INVENTION

Microelectronic devices are typically assembled into packages. Prior art processing may use a silicone based sealant to bond an integrated heat spreader (IHS) to a substrate. The strength of the IHS to substrate bond may impact several package failure modes, such as sealant delamination, corner cracking, IHS warpage etc. Gold and nickel have been used on the IHS to prevent the copper of the IHS from diffusing and oxidizing, for example.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PRESENT INVENTION

Figure 1A:
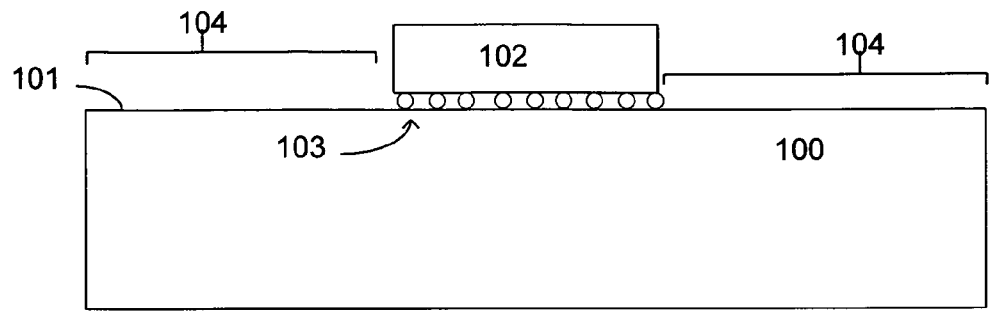
FIGS. 1a-1j represent structures according to embodiments of the present invention.
Figure 1B:
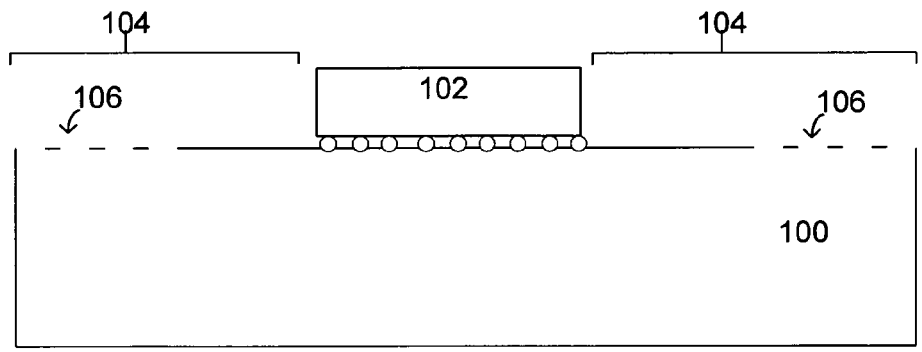

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated apparatus of fabricating microelectronic packages are described. Those methods may comprise forming a low melting point solder material on a solder resist opening (SRO) location of an IHS keep out zone (KOZ), forming a sealant in a non-SRO keep out zone region; attaching the IHS to the sealant, and then curing the sealant, wherein a solder joint is formed between the IHS and the low melting point solder material. Methods and apparatus of the present invention enable solder reinforced sealant for improved mechanical reliability and thermal performance of microelectronic packages.

FIGS. 1a-1j illustrate embodiments of methods and associated structures of fabricating microelectronic package structures according to the present invention. FIG. 1a illustrates a substrate 100. The substrate 100 may comprise a portion of a package structure in an embodiment, and may comprise a top surface 101. The substrate 100 may include in embodiments a substrate of any lidded package structure, packaged CPU's, chipsets, graphics and memory devices, as well as multi chip package (MCP) substrates. The substrate 100 may include any such substrate 100 that may electrically connect to a microelectronic device, such as a die.

In an embodiment, a die 102 may be attached to the substrate 100. In an embodiment, the die 102 may comprise a high power consumption die 102. In another embodiment, the die 102 may comprise a CPU die 102, for example. The die 102 may be attached to the substrate 100 with an array of interconnect structures 103, which may comprise a ball grid array, for example. A KOZ 104 may be disposed in a peripheral portion of the substrate 100 away from the die 102. The KOZ 104 may comprise an IHS KOZ 104 in an embodiment.

In an embodiment, the substrate 100 may be modified to form solder resist openings (SRO) in portions of the KOZ 104. In an embodiment, the SRO's 106 may be located in corner regions of the substrate 100, but in other embodiments the location may vary depending upon the particular application. In an embodiment, the SRO's may comprise portions of the KOZ 104 that have been modified to include exposed metal pads on the surface of a copper layer of the substrate 100. The SRO's 106 may serve to enable solder joint formation between the substrate 100 and an IHS that may be attached to the substrate 100 during subsequent processing.

Figure 1C:
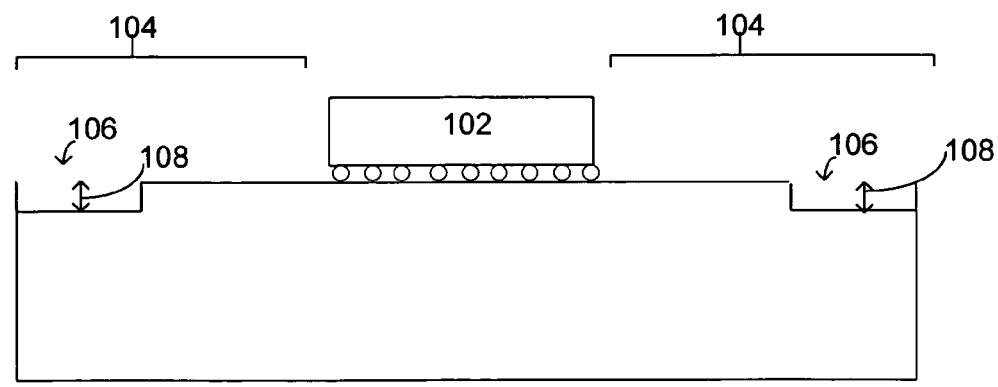
Figure 1D:
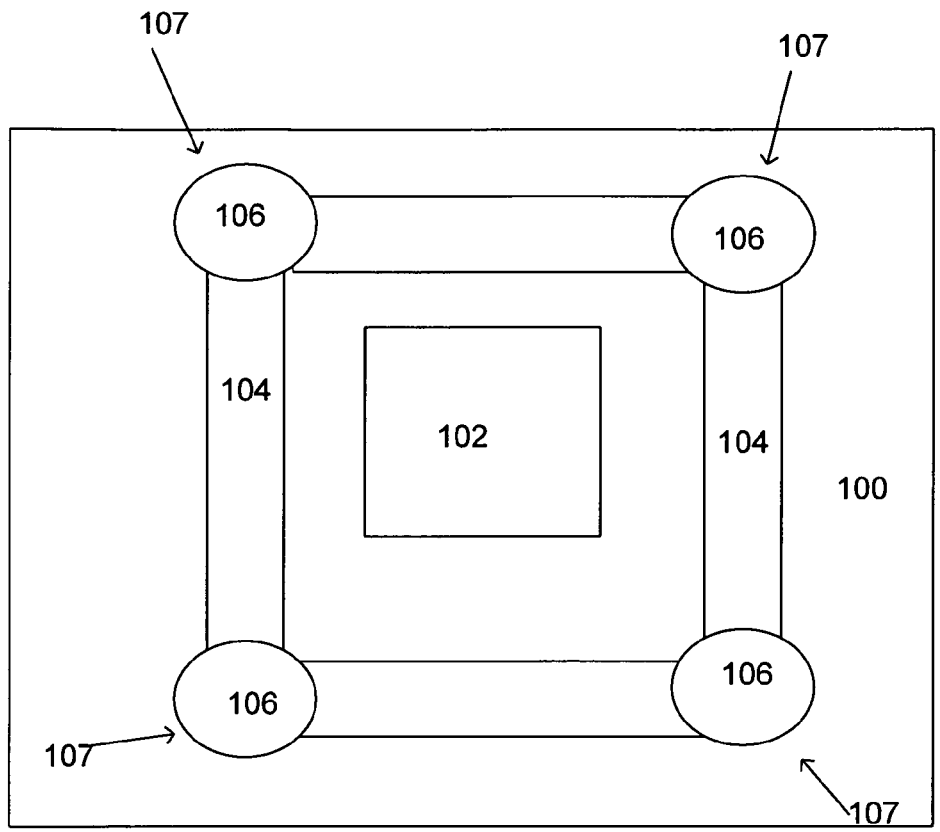

In an embodiment, the SRO 106 may be formed in the substrate 100 such that a portion of the substrate 100 may be removed to expose an underlying copper layer and pad structures (FIG. 1c). The SRO region 106 may then comprise a height 108. In other embodiments, the SRO regions 106 may be substantially coplanar with a top surface 101 of the substrate 100 (referring back to FIG. 1b). FIG. 1d depicts a top view of a package structure according to an embodiment, wherein the SRO regions 106 of the keep out zone 104 are located in corner regions 107 of the substrate 100.

Figure 1E:
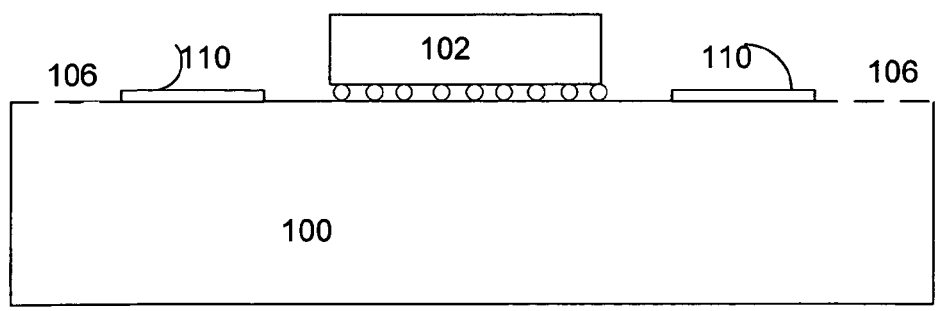
Figure 1F:
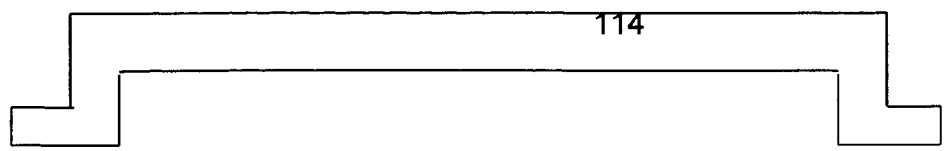
Figure 1G:
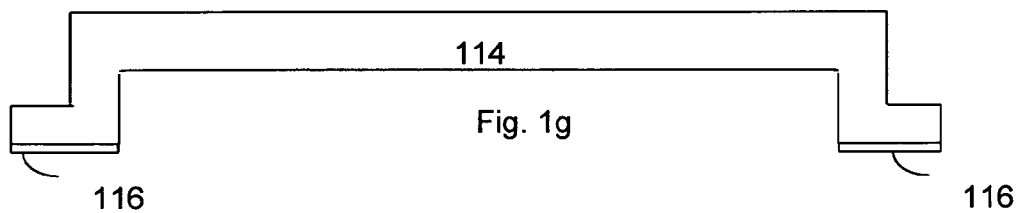
Figure 1H:
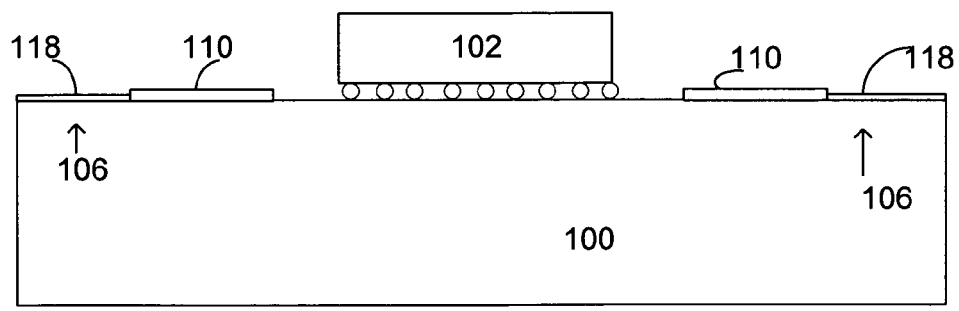

A sealant 110 may be dispensed/formed in the IHS KOZ but avoiding the exposed metal pads of the SRO regions 106 (FIG. 1e). The sealant 110 may be applied to the non SRO KOZ region 104 according to any suitable assembly process. In an embodiment, a flux coated low melting point solder material 116 may be pre-attached to an IHS 114 at specific locations on the IHS 114 leg (FIG. 1f-FIG. 1g). In an embodiment, the low melting point solder material 116 may be formed/dispensed at specific locations on the IHS leg to act as reinforcement in bonding the IHS 114 to the substrate 100. In an embodiment, paste printing may be employed during the IHS 114 attach process. In an embodiment, the solder 116 may be placed at a corner of the substrate or near notch locations, for example.

Figure 1I:
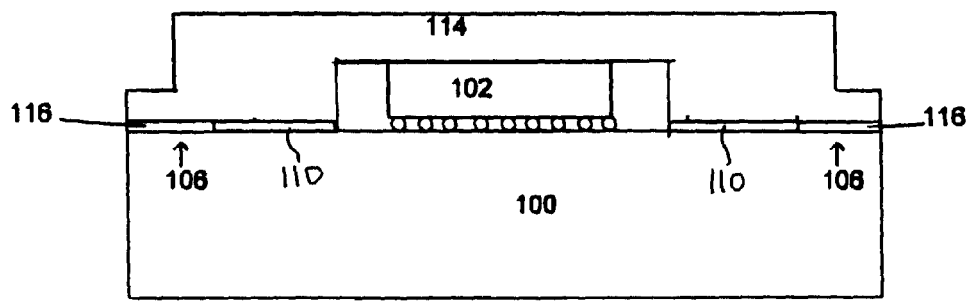

In an embodiment, flux 118 may be applied in SROs 106 of the substrate 100 locations to prepare the exposed metal of the substrate SRO regions 106, the low melting point solder 116, and the IHS 114 for solder joint formation (FIG. 1h), or in other embodiments the low melting point solder 116 can be flux coated incoming to the IHS attachment. The IHS 114 may be attached to the substrate 100 using any suitable attachment method (FIG. 1i).

Figure 1J:
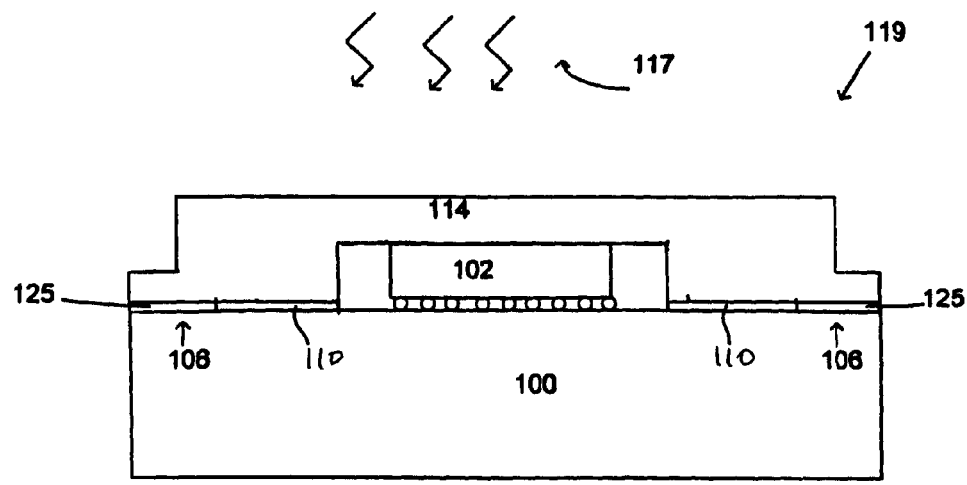

In an embodiment, the package structure 119 may be heated 117 to about 165 C. or below, wherein the low melting point solder 116 melts and forms a joint 125, and the sealant 110 simultaneously cures to form a bond (FIG. 1j). The melting point of the low melting point solder material 116 comprises a temperature substantially the same or lower then the sealant 110 cure temperature (typically 165 degrees Celsius or below, but may vary according to the particular application). The temperature profile used for the sealant cure will simultaneously create a solder joint between the IHS 114 and substrate 100. In an embodiment, the exposed metal pads on the surface copper areas of the substrate SRO 106 regions may react with the low melting point solder 116 to form the solder joint between the substrate and the IHS. In an embodiment, the use of low melting point solder material 116 in the SRO regions 106 may serve to solder down the IHS 114 to the substrate 100. Thus the low melting point solder 116 serves to act as reinforcement in bonding the IHS 114 to the substrate 100. Prior art processes typically use a silicone based sealant alone to bond an IHS to a substrate. Polymer materials used as sealants may suffer from a risk of sealant delamination and poor performance due to weak coupling between an IHS and the substrate.

The strength of an IHS to substrate bond can impact several package failure modes such as delamination, for example. Embodiments of the present invention enable stronger coupling between the IHS 114 and the substrate 100, as well as reducing sealant delamination failures. In an embodiment, the improved IHS to substrate coupling by using both the polymer sealant 110 and the low melting point solder material may be due to the formation of an intermetallic solder joint 125 between solder and the IHS 114 as well as the solder and the copper surface of the substrate 100. This solder joint 125 may serve to relieve sealant stresses and prevent delamination in the package structure 119. The improved strength of the IHS 114 to substrate 100 bond improves mechanical reliability of lidded packages. Additionally, significant improvement in thermal performance is enabled due to strong IHS to package coupling.

Figure 2J:
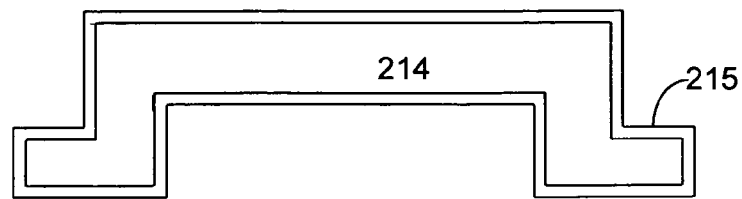
FIG. 2j represents structures according to the Prior Art.
Figure 2A:
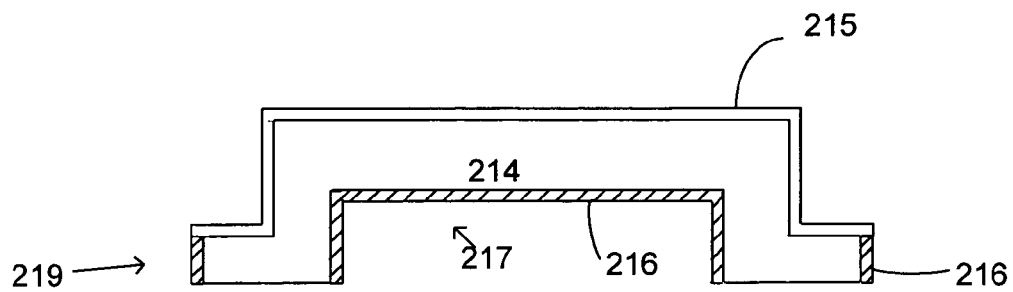
FIGS. 2a-2i represent structures according to embodiments of the present invention.

In another embodiment, exposed copper may be used to improve adhesion of a sealant to an IHS. Prior art IHS 214 structures may use a nickel 215 coating on the copper IHS 214 to prevent oxidation (FIG. 2j). However the nickel surface of the IHS typically exhibits poor adhesion to a substrate sealant, leading to sealant delamination. An exposed copper surface of the IHS allows for improved adhesion to the sealant material. An OSP (organic surface protectant) finish, that may comprise a thin polymer film, may further be utilized to protect the exposed copper of the IHS from further oxidation when exposed to the environment. In an embodiment, the surface finish on an inner cavity/IHS leg may be modified during IHS manufacturing to have an exposed copper surface with an OSP finish and nickel passivation on an upper portion of the IHS. In one embodiment, an OSP finish 216 may be disposed on substantially all of an inner cavity portion 217 of an IHS 214 and on an outer portion of the IHS leg 219 (FIG. 2a). Nickel coating 215 may be disposed on an upper portion of the 214.

Figure 2B:
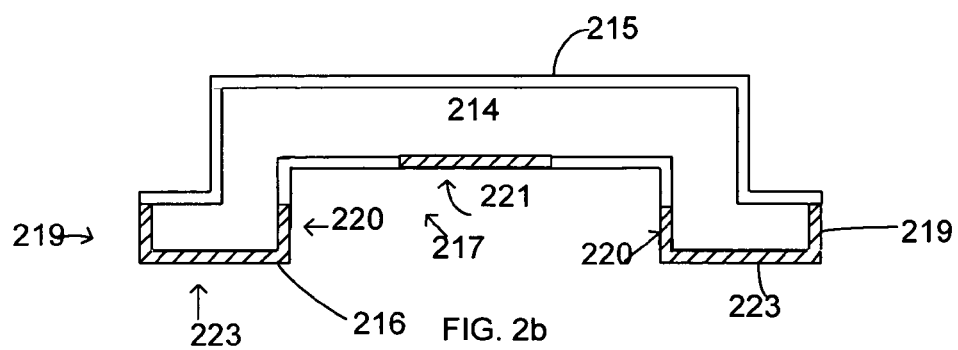
Figure 2C:
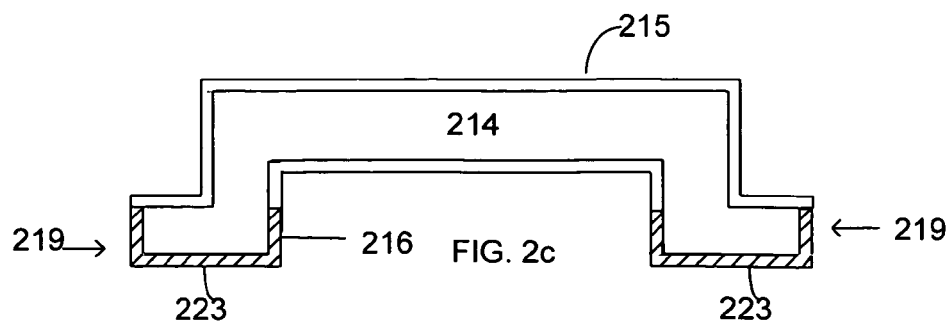

In another embodiment, an OSP finish 216 may be disposed on a central portion 221 and a lower inner portion 220 of the inner cavity portion 217 of an IHS 214, and on a bottom portion of the leg 223 and on the lower outer portion of the IHS leg 219 (FIG. 2b). Nickel coating 215 may be disposed on an upper portion of the IHS 214. In another embodiment, an OSP finish 216 may be disposed on a lower portion of the leg 223 and on the lower outer portion of the IHS leg 219 (FIG. 2c). Nickel coating 215 may be disposed on an upper portion of the IHS 214.

Figure 2D:
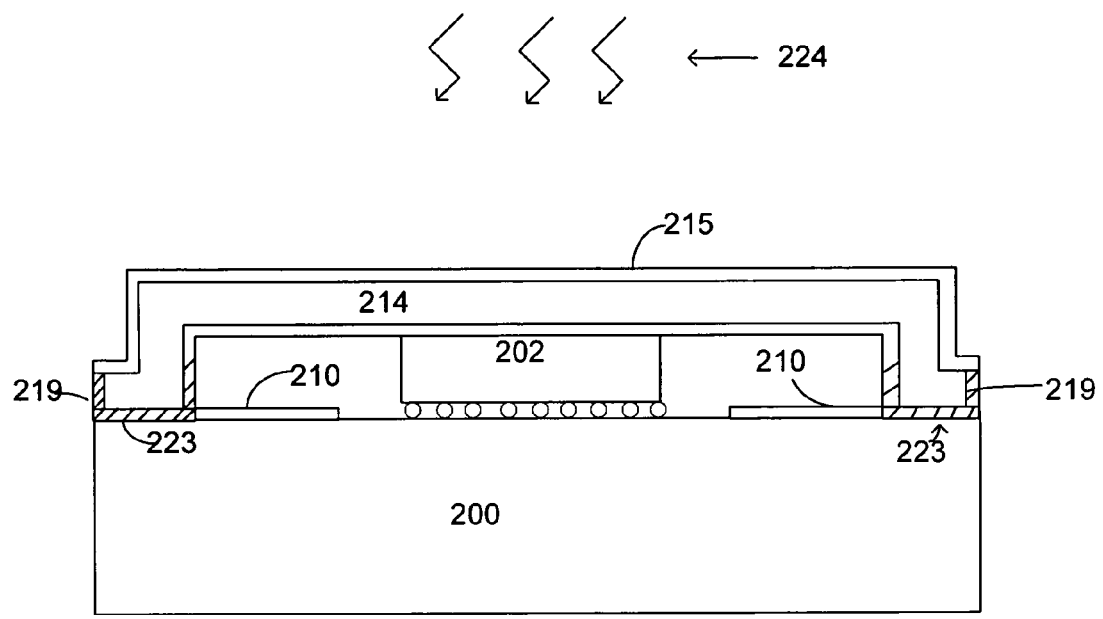
Figure 2E:
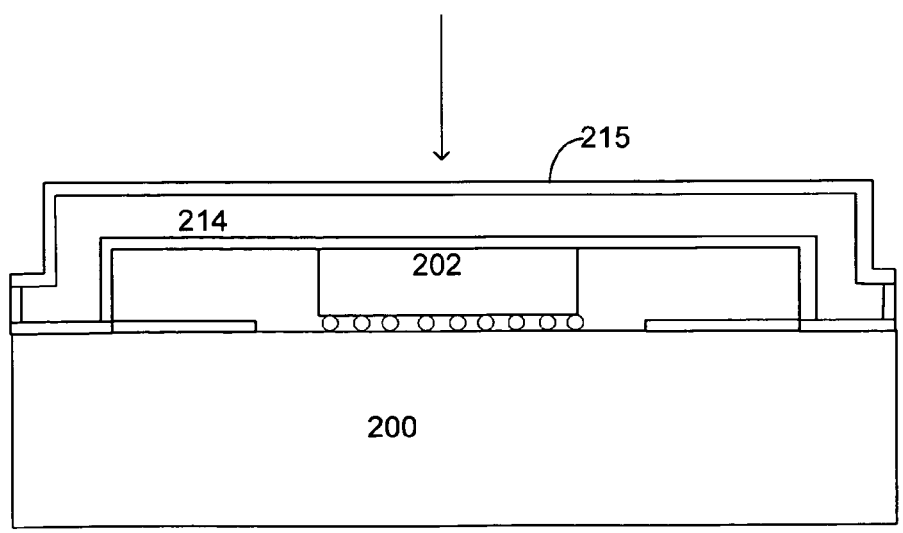
Figure 2F:
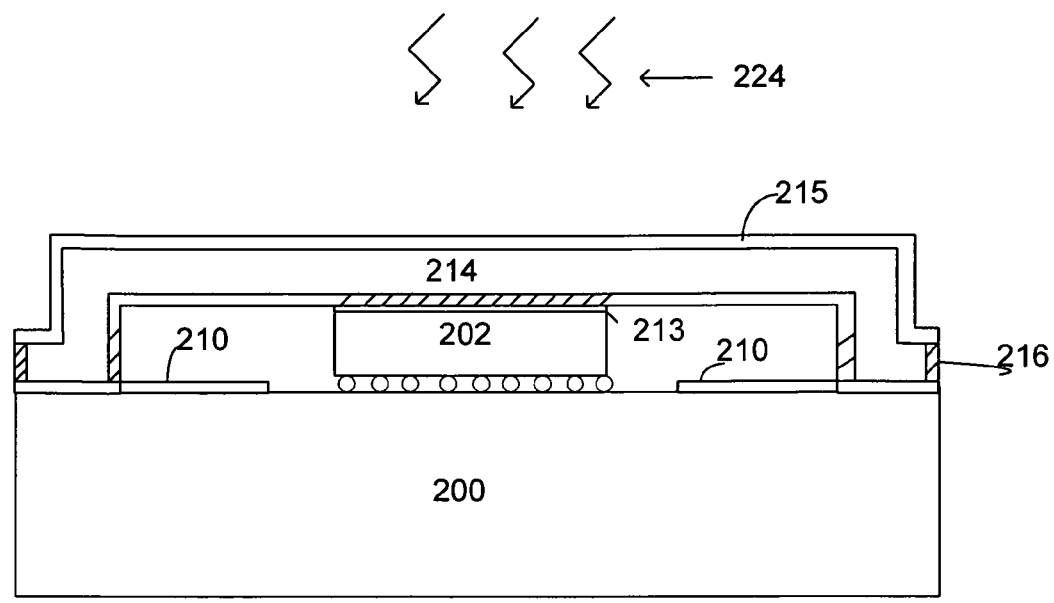
Figure 2G:
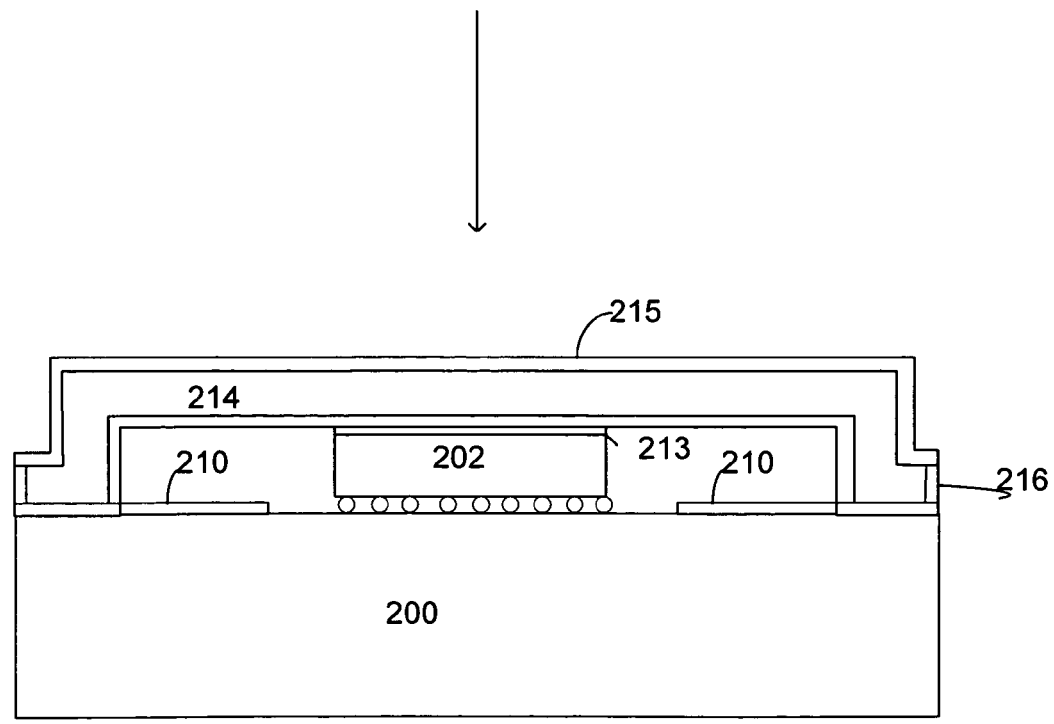
Figure 2H:
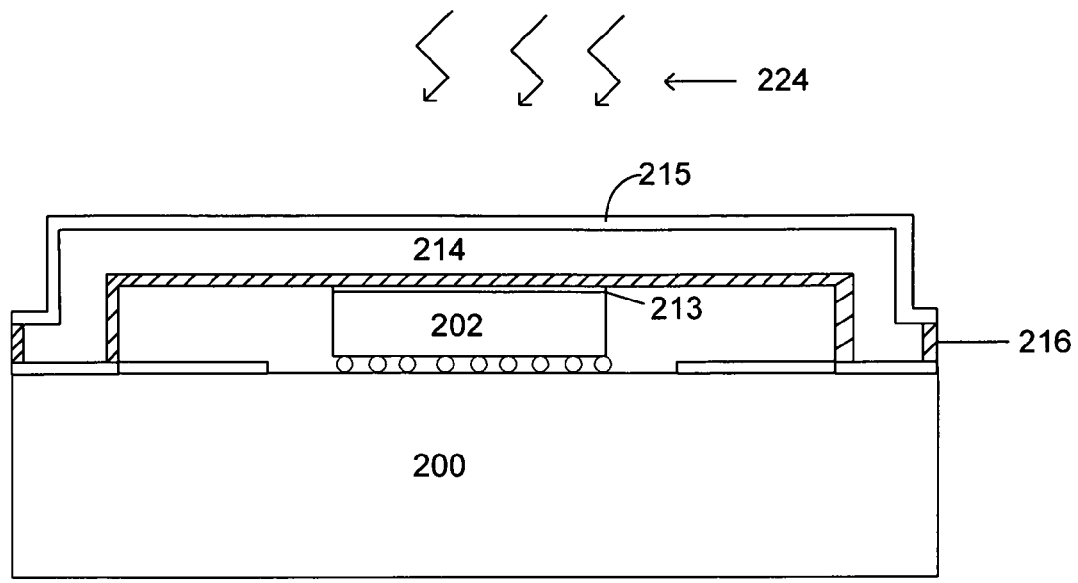
Figure 2I:
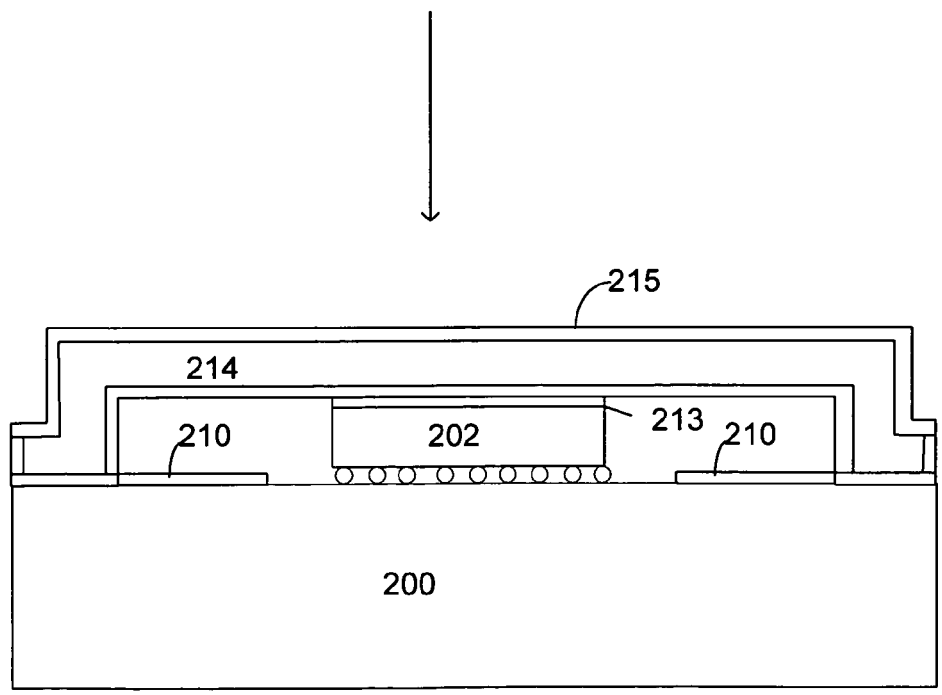

When taken to high temperatures 224, such as the IHS attachment process temperature, for example, the OSP 216 of an IHS 214, such as the OSP 216 of FIG. 2c for example, may volatilize/dissolve (FIGS. 2d-2e). This enables improved adhesion between the sealant 210 and/or a TIM 213 (see FIGS. 2f-2g and FIGS. 2h-2i). of the package structure with the copper surface (since the OSP is now removed by the heated process) of the IHS 214. The temperature 224 of the IHS attachment process may comprise the sealant curing temperature in an embodiment, and may comprise about 165 degrees Celsius or below in some cases. The embodiments are especially useful for stiff epoxy based sealants that provide a strong coupling between the IHS and the substrate but have a high risk of delamination when bonded to a nickel coated IHS.

The use of the OSP surface finish 216 on the IHS 214 legs/inner cavity prevents the copper from further oxidation. This enables control of the quality of the IHS 214 surface and promotes improved adhesion to the sealant 210. The OSP layer 216 is a sacrificial chemical layer, that may comprise imidazoles that may be coordinated to the etched copper surface of the IHS 216 during manufacturing to prevent copper oxidation before IHS attachment, in an embodiment. The various embodiments promote improved package reliability and thermal performance of package structures.

Benefits of the various embodiments of the present invention include reduction/elimination of sealant delamination, decrease in warpage failure, decreased cracking and improvement in thermal performance due to strong IHS to package coupling. Mechanical reliability of lidded packages is improved.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. It is appreciated that the Figures provided herein illustrate only portions of an exemplary package assembly that pertains to the practice of the present invention. Thus the present invention is not limited to the structures described herein.

What is claimed is:

1. A structure comprising:
    a substrate having a substrate solder resist opening (SRO) location and a keep out zone;
    a sealant in direct contact with the substrate in the keep out zone of the substrate;
    an integrated heat spreader (IHS) having a nickel coated portion and an exposed copper portion, the exposed copper portion of the integrated heat spreader (IHS) attached to the sealant in the keep out zone of the substrate, and wherein the nickel coated portion is disposed on an upper portion of the integrated heat spreader (IHS) and a first inner portion of the integrated heat spreader (IHS); and
    a solder joint disposed between the substrate solder resist opening (SRO) location and the integrated heat spreader (IHS), the solder joint directly attaching the integrated heat spreader (IHS) to the substrate at the solder resist opening location.

2. The structure of claim 1 wherein the solder joint comprises a material with a melting point substantially the same or below the sealant melting point.

3. The structure of claim 1 wherein the sealant comprises a melting point below 165 degrees Celsius.

4. The structure of claim 1 further comprising a second inner portion of the integrated heat spreader (IHS) that does not comprise the nickel coated portion.

5. The structure of claim 1 further comprising wherein the substrate comprises a portion of a microelectronic package.

6. The structure of claim 1 further comprising wherein the solder resist opening (SRO) location is located in at least one of a corner of the integrated heat spreader (IHS) or near a notch location of the integrated heat spreader (IHS).

7. The structure of claim 1 wherein the integrated heat spreader (IHS) comprises copper and the sealant comprises silicone.

8. A microelectronic package comprising:
a die attached to a substrate;
an integrated heat spreader (IHS) having a nickel coated portion and an exposed copper portion thermally coupled to said die and attached to said substrate, wherein the integrated heat spreader (IHS) is directly attached to said substrate at a first location by a solder joint and wherein the exposed copper portion of the integrated heat spreader (IHS) is directly attached to said substrate at a second location different than said first location by a sealant, and wherein the nickel coated portion is disposed on an upper portion of the integrated heat spreader (IHS) and a first inner portion of the integrated heat spreader (IHS) that is not thermally coupled to the die.

9. The microelectronic package of claim 8 wherein the solder joint comprises a material with a melting point substantially the same or below the melting point of said sealant.

10. The microelectronic package of claim 8 wherein the sealant has a melting point below 165° C.

11. The microelectronic package of claim 8 wherein the first location is in at least one of a corner of the integrated heat spreader (IHS) or near a notch location of the integrated heat spreader (IHS).

12. The microelectronic package of claim 8 wherein the integrated heat spreader (IHS) comprises copper and the sealant comprises silicone.

* * * * *